United States Patent [19]

Hata et al.

[11] Patent Number: 4,815,913

[45] Date of Patent: Mar. 28, 1989

[54] ELECTRONIC COMPONENT MOUNTING DEVICE

[75] Inventors: Kanji Hata, Katano; Masahiro Maruyama, Mino; Eiji Itemadani, Sakai, all of Japan

[73] Assignee: Matsushita Electric Industrial Co., Ltd., Osaka, Japan

[21] Appl. No.: 168,314

[22] Filed: Mar. 17, 1988

[30] Foreign Application Priority Data

Mar. 20, 1987 [JP] Japan .................................. 62-66384

[51] Int. Cl.⁴ .............................................. B23Q 7/04
[52] U.S. Cl. ...................................... 414/225; 29/729; 74/57; 198/471.1; 414/744.3; 901/40
[58] Field of Search ........... 414/744 R, 744 A, 744 B, 414/744 C, 225; 29/729, 740, 741; 198/471.1; 74/57; 901/40

[56] References Cited

U.S. PATENT DOCUMENTS 4,027,767 6/1977 Gluck ............................... 414/744 R
4,556,362 12/1985 Bahnck et al. ................... 414/744 B

*Primary Examiner*—Robert J. Spar
*Assistant Examiner*—Donald W. Underwood
*Attorney, Agent, or Firm*—Wenderoth, Lind & Ponack

[57] ABSTRACT

An electronic component mounting device for mounting an electronic component onto a circuit-board, is provided with an intermittently rotatable rotary frame, a plurality of elevating members disposed around and along the periphery of the rotary frame at regular intervals so as to be free to move up and down, a plurality of electronic component holding members respectively securely mounted on the elevating members each to hold one electronic component at a time, an index unit for controlling the intermittent rotation of the rotary frame by way of a shaft, a cam mechanism for moving the elevating members up and down with the rotation of the rotary frame, and an operating member for moving any one of the electronic component holding members up and down. The index unit can interrupt the rotation of the rotary frame to bring each electronic component holding member to a stop at least at one location suitable for supplying each electronic component and at another location suitable for mounting each electronic component onto the circuit-board. The operating member is driven by a linear motor so that each electronic component is firmly mounted onto the circuit-board.

2 Claims, 3 Drawing Sheets

ELECTRONIC COMPONENT MOUNTING DEVICE

BACKGROUND OF THE INVENTION

1. Field of the Invention

The present invention relates to an electronic component mounting device for mounting an electronic component onto a circuit-board.

2. Description of the Prior Art

Conventionally, there have been proposed various kinds of devices for mounting an electronic component such as a chip resistor, a chip multilayer capacitor or the like onto a circuit-board. One of them is well known as a rotary type mounting device which is capable of executing the mounting operation in high speed. The rotary type mounting device includes an intermittently rotatable rotary frame, a plurality of holding members each comprising a suction nozzle etc. mounted on the rotary frame and the like. Each holding member is moved up and down by means of a stationary cam with the rotation of the rotary frame so that an electronic component may be held by the holding member at a location suitable for supplying the electronic component. The electronic component is then conveyed to another location suitable for mounting the electronic component onto the circuit-board by the rotation of the rotary frame so that the electronic component may be mounted onto the circuit-board by moving the holding member up and down.

The applicant of the present invention has proposed Japanese Patent Laid-open Application (Tokkaisho) No. 61-119100 in which, as shown in FIG. 1, each of a plurality of holding members 32 is moved up and down by the operation of a linear motor 33, but not by way of the stationary cam. In FIG. 1, 30, 31, 34 and 35 respectively designate electronic components, a rotary frame, an electronic component supplying device and a circuit-board onto which one or more electronic components are firmly mounted, with the circuit-board 35 being placed on a mounting table 36.

In the conventional mounting device of the type employing therein the stationary cam, however, the position of each holding member in a vertical direction is fixedly determined on the basis of a position where the rotary frame rotates. Accordingly, in the case where various kinds of the electronic components different in height are desired to be mounted onto the circuit-board, pressure to be applied to each electronic component can not be adjusted, thus resulting in that the electronic components are occasionally subjected to cracks or any other damage.

On the other hand, the mounting device of the type employing therein the linear motor, as disclosed in the aforementioned disclosure, can remove the above described problem. However, this kind of device necessitates the linear motors 33 having a relatively large stroke, since the holding members 32 are driven by respective linear motors 33 throughout their entire stroke. Each of the linear motors 33, therefore, inevitably occupies a wide space at a location suitable for mounting the electronic component in spite of the fact that such a location is required to be left unoccupied for a variety of work, thus resulting in poor workability. Furthermore, since each one holding member 32 needs one linear motor 33, the device have been manufactured disadvantageously at high cost. Also, this device needs a complicated electric supply system, since electric power for controlling a plurality of linear motors 33 set on the rotary frame 31 is supplied from a certain fixedly arranged portion.

SUMMARY OF THE INVENTION

Accordingly, the present invention has been developed with a view to substantially eliminating the above described disadvantages inherent in the prior art electronic component mounting device, and has for its essential object to provide an improved electronic component mounting device which is capable of mounting the electronic component, even though they are different in height, onto respective positions of a circuit-board in high speed without any cracks or any other damage.

Another important object of the present invention is to provide an electronic component mounting device of the above described type which is improved in workability at a location suitable for mouting the electronic component.

A further object of the present invention is to provide an electronic component mounting device of the above described type which is simple in construction and stable in functioning, and can be readily manufactured at low cost.

In accomplishing these and other objects, according to one preferred embodiment of the present invention, there is provided an electronic component mounting device for mounting an electronic component onto a circuit-board, which includes an intermittently rotatable rotary frame, a plurality of elevating members disposed around and along the periphery of the rotary frame at regular intervals so as to be free to move up and down, a plurality of electronic component holding members respectively securely mounted on the elevating members each to hold one electronic component at a time, a driving means for controlling the rotary frame to rotate intermittently so that each electronic component holding member may be brought to a stop at least at a first location suitable for supplying each electronic component and at a second location suitable for mounting each electronic component onto the circuit-board, a cam means for moving the elevating members up and down with the rotation of the rotary frame, and an operating means driven by a linear motor at the second location to move any one of the electronic component holding members up and down.

By the above described construction of the present invention, the elevating members together with the electronic component holding members are caused to move up and down by the cam means with the rotation of the rotary frame. Accordingly, each electronic component holding member catches one electronic component at a time at the first location and is then caused to move towards the second location and simultaneously downwards close to the circuit-board on which the electronic component is firmly mounted. At the second location, the electronic component holding member is further moved up and down by the linear motor so that the electronic component may be mounted onto the circuit-board. In this way, since each electronic component holding member is driven by the linear motor at the mounting of the electronic component onto the circuit-board, none of the electronic components are subjected to cracks or any other damage, even though they are different in height.

Furthermore, the device of the present invention is merely provided as the driving means with the cam means for moving the elevating members up and down with the rotation of the rotary frame and the linear motor having a relatively short stroke and disposed at the second location. Because of this, not only the device can be readily manufactured into a simple construction at low cost, but also a relatively wide space can be ensured at the second location to improve the workability.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and in which.

DETAILED DESCRIPTION OF THE PREFERRED EMBODIMENT

Figure 1:
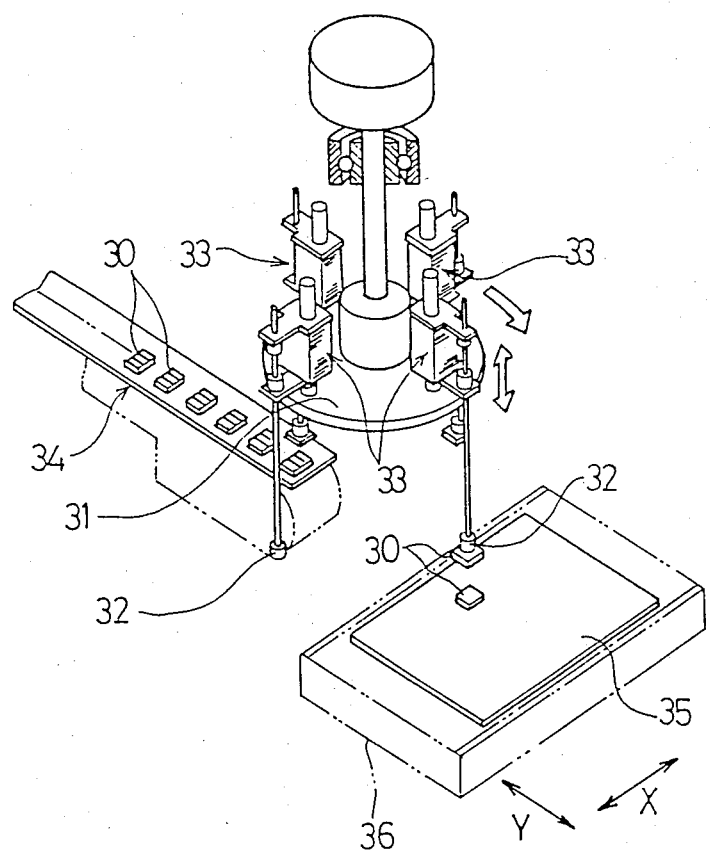
FIG. 1 is a perspective view of a conventional electronic component mounting device.
Figure 2:
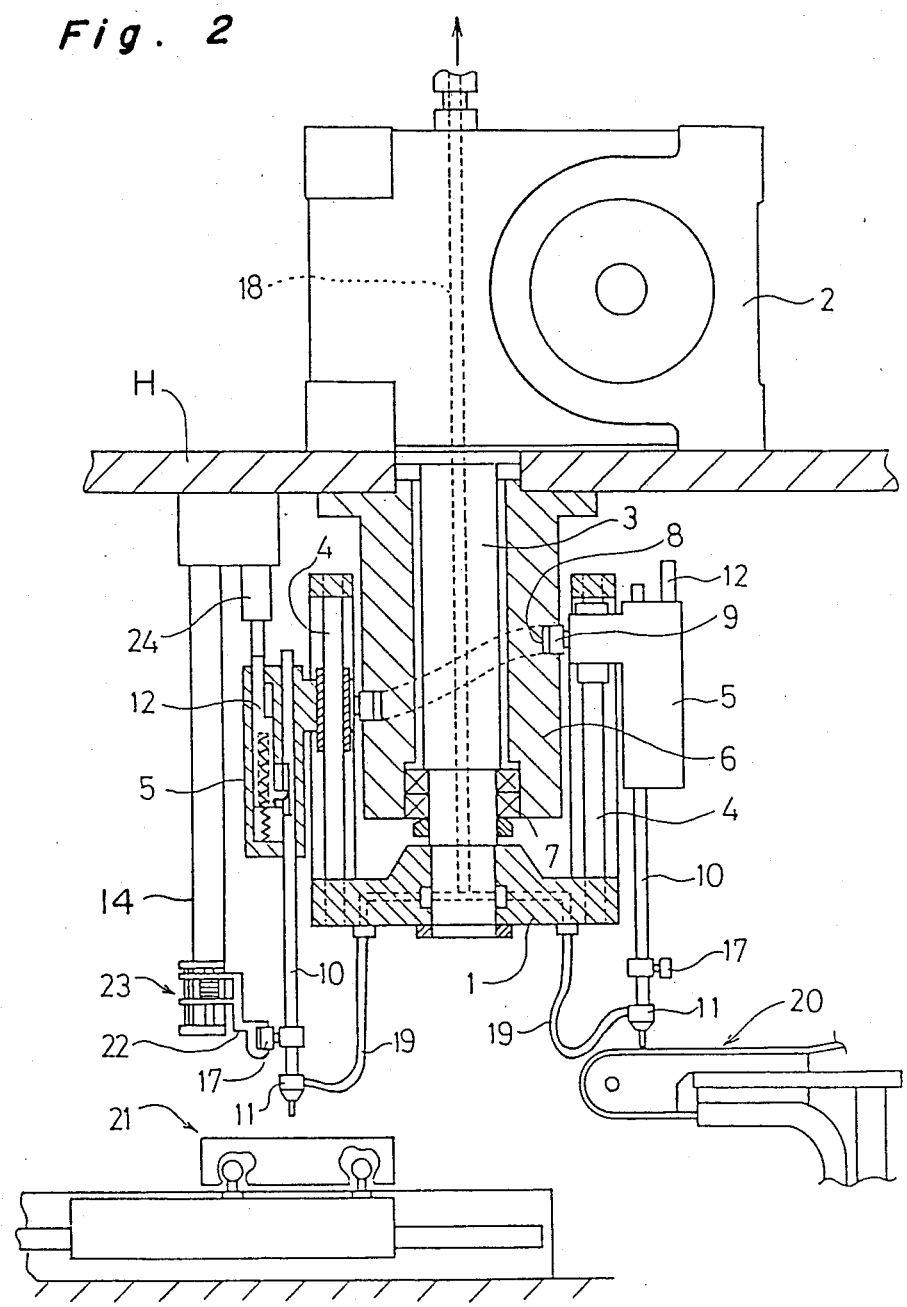
FIG. 2 is a longitudinal sectional view of an electronic component mounting device according to an embodiment of the present invention.

Referring first to FIG. 2, a rotary frame 1 is securely mounted on the lower end portion of a rotary shaft 3, which is loosely inserted into a cylindrical support member 6 and extends downwards from an index unit 2. Both of the support member 6 and the index unit 2 are rigidly secured to a housing H. A plurality of elevating members 5 are disposed around and along the periphery of the rotary frame 1 at regular intervals so that each of them may be free to move up and down by way of a guide shaft 4 rigidly connected to the rotary frame 1. The interval between adjacent elevating members 5 corresponding to a rotational angle, in accordance with which the rotary frame 1 can intermittently rotate about and together with the rotary shaft 3 by the operation of the index unit 2. A bearing 7 is interposed between the lower inner surface of the support member 6 and the rotary shaft 3 to rotatably support therein the rotary shaft 3. The support member 6 is provided with a cam groove 8 formed in the outer peripheral surface thereof. A cam roller 9 is rotatably mounted on each elevating member 5 by way of a rod and is brought into engagement with the cam groove 8.

Figure 3:
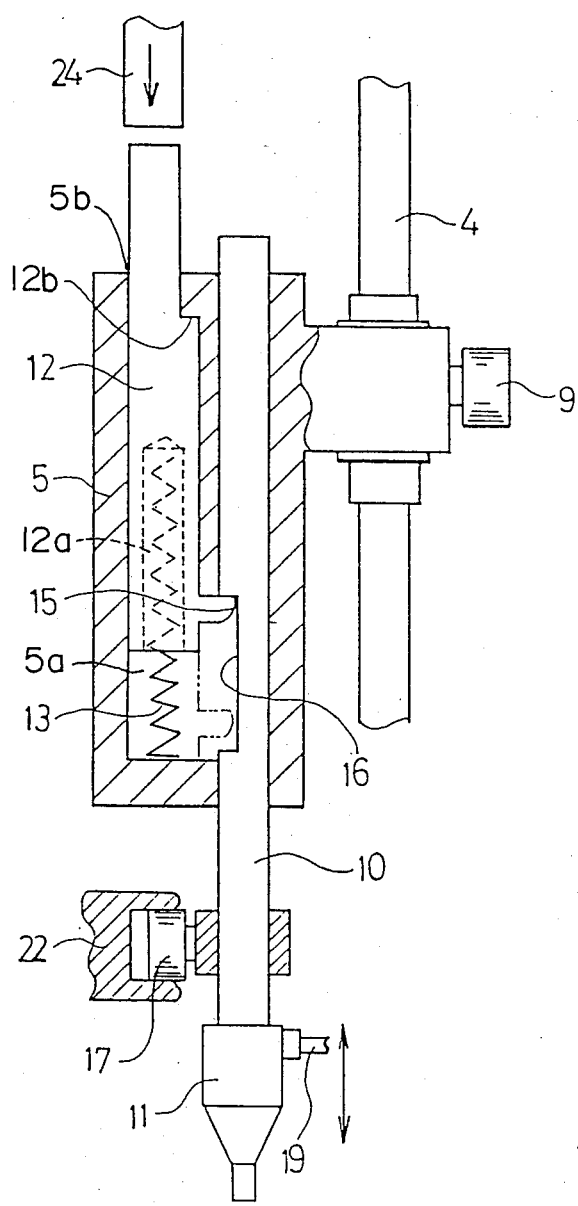
FIG. 3 is a longitudinal sectional view of an elevating member employed in the electronic component mounting device of FIG. 2.

As shown in FIG. 3, the elevating member 5 is provided with a vertically movable elevating shaft 10 extending therethrough, on the lower end portion of which is mounted a suction nozzle 11 as a holding member for holding one electronic component at a time on its lower end. The elevating member 5 has a cavity 5a for accommodating an operating shaft 12 continuously biased upwards by means of a compression spring 13. The compression spring 13 has one end in contact with the lower inner surface of the elevating member 5 and the other end inserted into a recess 12a formed in the lower portion of the operating shaft 12. The operating shaft 12 can protrude upwards from the elevating member 5 through an opening 5b formed in an upper portion of the elevating member 5 by the action of the compression spring 13, until a shoulder portion 12b of the operating shaft 12 is brought into contact with the upper inner surface of the elevating member 5. The elevating shaft 10 and the operating shaft 12 are spaced from each other in a parallel relationship with each other in the elevating member 5. A projection 15 is integrally formed with a lower portion of the operating shaft 12 and protrudes towards the elevating shaft 10 so as to be inserted into a recess 16 formed in an intermediate side portion of the elevating shaft 10 within a suitable length thereof. The projection 15 is normally in contact with the top of the recess 16 to support the elevating shaft 10 thereon and prevents the elevating shaft 10 from rotating. A guide roller 17 is rotatably mounted on a lower portion of the elevating shaft 10 through a rod.

One common suction passage 18 communicating a suction source (not shown) through a hose or pipe (not shown) is formed in the index unit 2, the rotary shaft 3 and the rotary frame 1 and is branched, in the rotary frame 1, into a plurality of passages each communicating one suction nozzle 11 by way of a suction hose 19.

An electronic component supply means 20 is located immediatey below one of the suction nozzles 11 mounted on the elevating shafts 10, that is to say, at one of locations where the elevating members 5 are permitted to stop in accordance with the intermittent rotation of the rotary frame 1. A mounting table 21 for placing thereon the circuit-board is disposed immediately below the other one of the suction nozzles 11 on the downstream side of the electronic component supply means 20 with respect to the rotation of the rotary frame 1. Each electronic component is securely mounted onto the circuit-board placed on the mounting table 21. When any one of the elevating members 5 has been brought to a stop at the location where the electronic component is mounted on the circuit-board, the guide roller 17 mounted on the elevating shaft 10 engages at its upper and lower portions with an operating member 22 which is driven up and down by a linear motor 23 rigidly secured to the device housing H by way of a support pillar 14. In this event, immediately above the operating shaft 12 is located a pressure applying means 24 rigidly secured to the device housing H for applying pressure to the operating shaft 12 downwards.

Figure 4:
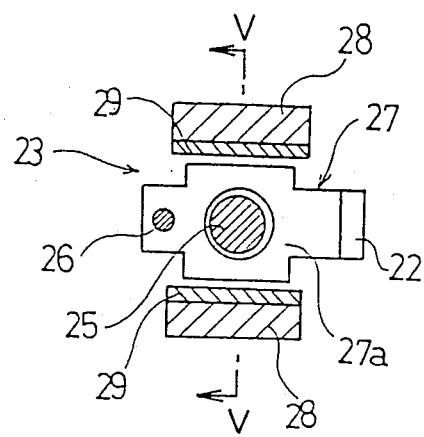
FIG. 4 is a horizontal sectional view of a linear motor for moving the elevating member up and down.
Figure 5:
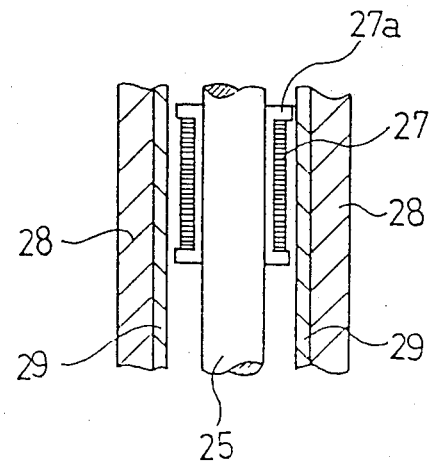
FIG. 5 is a section taken along the line V—V in FIG. 4.

As shown in FIGS. 4 and 5, the linear motor 23 comprises an inner yoke 25, a guide shaft 26, a movable coil 27 having a coil bobbin 27a vertically movably supported on the guide shaft 26, a pair of outer yokes 28 and a pair of permanent magnets 29 mounted on the inner surfaces of respective outer yokes 28, with the inner yoke 25 being loosely inserted into the coil 27. The inner and outer yokes 25 and 28 are securely connected with each other at their opposite ends and constitute, together with the permanent magnets 29, a magnetic circuit.

By the above described construction, since the cam roller 9 of each elevating member 5 engages with the cam groove 8, the elevating members 5 and the elevating shafts 10 move up and down with the rotation of the rotary frame 1, and therefore, the suction nozzles 11 mounted on the lower ends of respective elevating shafts 10 are caused to move up and down. One of the suction nozzles 11 is caused to move down towards the electronic component supply means 20 at the location for supplying the electronic components, through the downward movement of the elevating member 5 depending on the cam groove 8, to attract one electronic component. Thereafter, the suction nozzle 11 is caused to move upwards and is then transported towards the location for mounting the electronic component onto the circuit-board, i.e., the location where the mounting table 21 is provided. At this location, the suction nozzle 11 together with the electronic component is moved downwards to a position immediatley above another position where the electronic component is brought into contact with the circuit-board. Thus, the guide roller 17 is brought into engagement with the operating member 22 and, the operating shaft 12 is depressed downwards by the pressure applying means 24. As a result, the support of the elevating shaft 10 by the projection 15 is released, as shown by a phantom line in FIG. 3, so that the linear motor 23 can drive the elevating shaft 10 up and down. Upon downward movement of the suction nozzle 11 by the operation of the linear motor 23, the electronic component attracted to the suction nozzle 11 is pressed against the circuit-board under a predetermined pressure to be firmly mounted thereto. Upon completion of the mounting of the electronic component, the elevating shaft 10 is caused to move upwards by the linear motor 23 after the releasement of the electronic component from the suction nozzle 11, and simultaneously, the pressure applying means 24 is restored to its original position where it can not depress the operating shaft 12 any more. Thus, the elevating shaft 10 is supported again by the projection 15 of the operating shaft 12. Thereafter, upon rotation of the rotary frame 1, the engagement between the guide roller 17 and the operating member 22 is released so that the vertical movement of the elevating member 5 may be permitted again through the engagement between the cam roller 9 and the cam groove 8. Then, the next electronic component is drawn to the suction nozzle 11 at the location for supplying the electronic component and the above described operation is repeated.

In this way, a plurality of or a large number of the electronic components are supplied intermittently one by one by the electronic component supplying device 20 to the circuit-boards to be firmly mounted thereon. Immediately before the mounting of the electronic component onto the circuit-board, the downward movement thereof is controlled first by the cam groove 8 and then by the linear motor 23. This change-over can facilitate the control of the suction nozzle 11 in its elevating speed and in its stop position in a vertical direction and can make the pressure applied to the electronic component against the circuit-board substantially constant. Accordingly, even if the electronic components are different in height, the constant pressure can be applied thereto, and thus, any possible damage such as cracks of the electronic component or the like can be prevented.

It is to be noted here that, in the above described embodiment, although the suction nozzle 11 is employed as the holding means for holding the electronic component, a holding claw member or the like may be employed as the holding means.

It is also to be noted that a particular construction of the cam means or how to drive the holding member by the linear motor may be optionally designed.

According to the electronic component mounting device of the present invention, since each holding member is driven by the linear motor during the mounting of the electronic component, any electronic components, even if they are different in height, can be assuredly mounted onto respective positions of the circuit-boards without any cracks or any other damage. The mounting device of the present invention is merely provided as the driving means with the cam driving means for moving the elevating members up and down with the rotation of the rotary frame and the linear motor having a relatively short stroke and disposed at the location for mounting the electronic component onto the circuit-board. As a result, not only the device is simple in construction and can be readily manufactured at low cost, but also a relatively wide space can be ensured at the location for mounting the electronic component to improve the workability.

In addition, the device of the present invention enables the high speed mounting, since this device is of the rotary type employing therein both the cam driving means and the linear motor which is high in starting speed. Moreover, since the mounting operation which needs high accuracy in positioning the electronic component is executed by the linear motor, the device does not require the cam driving means formed in high accuracy. The device of the present invention can be, therefore, manufactured at reduced cost and can be readily adjusted.

Although the present invention has been fully described by way of examples with reference to the accompanying drawings, it is to be noted that various changes and modifications will be apparent to those skilled in the art. Therefore, unless such changes and modifications otherwise depart from the spirit and scope of the present invention, they should be construed as being included therein.

What is claimed is:

1. An electronic component mounting device comprising:
   an intermittently rotatable rotary frame;
   a plurality of elevating members disposed around and along the periphery of said rotary frame at regular intervals so as to be free to move up and down;
   a plurality of electronic component holding means respectively securely mounted on said elevating members each to hold one electronic component at a time;
   a driving means for controlling said rotary frame to rotate intermittently so that each of said electronic component holding means may be brought to a stop at least at a first location suitable for supplying each electronic component and a second location suitable for mounting each electronic component;
   a cam means for moving said elevating members up and down with the rotation of said rotary frame; and
   an operating means driven by a linear motor at said second location to move any one of said electronic component holding means up and down.

2. An electronic component mounting device as claimed in claim 1, wherein each of said electronic component holding means comprises a suction nozzle.

* * * * *